(12) United States Patent
Xu

(10) Patent No.: US 12,127,347 B2
(45) Date of Patent: Oct. 22, 2024

(54) PRINTED CIRCUIT BOARD PCB ASSEMBLY AND ELECTRONIC DEVICE

(71) Applicant: HONOR DEVICE CO., LTD., Guangdong (CN)

(72) Inventor: Zhijie Xu, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/041,042

(22) PCT Filed: Aug. 30, 2022

(86) PCT No.: PCT/CN2022/115914
§ 371 (c)(1),
(2) Date: Feb. 8, 2023

(87) PCT Pub. No.: WO2023/065836
PCT Pub. Date: Apr. 27, 2023

(65) Prior Publication Data
US 2024/0268032 A1    Aug. 8, 2024

(30) Foreign Application Priority Data
Oct. 19, 2021   (CN) .......................... 202111216999.X

(51) Int. Cl.
*H05K 1/18* (2006.01)
*H05K 3/32* (2006.01)

(52) U.S. Cl.
CPC ............. *H05K 1/183* (2013.01); *H05K 3/328* (2013.01); *H05K 2201/09036* (2013.01); *H05K 2201/09472* (2013.01); *H05K 2201/10037* (2013.01)

(58) Field of Classification Search
CPC ...................................................... H05K 1/183
See application file for complete search history.

(56) References Cited

U.S. PATENT DOCUMENTS

| 6,676,440 B1 | 1/2004 | Inamine et al. |
| 2014/0201996 A1 | 7/2014 | Robertson et al. |

(Continued)

FOREIGN PATENT DOCUMENTS

| CN | 1787542 A | 6/2006 |
| CN | 201690250 U | 12/2010 |

(Continued)

OTHER PUBLICATIONS

Extended European Search Report in European Appln No. 22847104.1, dated Jul. 9, 2024, 7 pages.

*Primary Examiner* — Jeremy C Norris
(74) *Attorney, Agent, or Firm* — Fish & Richardson P.C.

(57) ABSTRACT

Embodiments of this application are applied to the field of terminal technologies, and provide a PCB assembly and an electronic device, where the PCB assembly includes a PCB, a first conductor, a first battery, and a second battery. The PCB includes a groove area. The first battery and the second battery are disposed on different sides of the groove area. The first conductor is disposed in the groove area, and the first conductor is configured to connect the first battery and the second battery. That is, in the embodiments of this application, the first battery and the second battery are connected by using the first conductor in the groove area, which prevents a power cable connecting the first battery and the second battery from occupying an area on the PCB, thereby increasing an area in which other components can be installed on the PCB.

10 Claims, 8 Drawing Sheets

(56) References Cited

U.S. PATENT DOCUMENTS

| | | |
|---|---|---|
| 2017/0025660 A1 | 1/2017 | Shin et al. |
| 2017/0301907 A1 | 10/2017 | Park et al. |
| 2019/0131664 A1 | 5/2019 | Ardisana, II et al. |
| 2022/0181732 A1 | 6/2022 | Weis |

FOREIGN PATENT DOCUMENTS

| | | |
|---|---|---|
| CN | 107078238 A | 8/2017 |
| CN | 208401972 U | 1/2019 |
| CN | 111247684 A | 6/2020 |
| CN | 111988455 A | 11/2020 |
| CN | 212723800 U | 3/2021 |
| CN | 213817321 U | 7/2021 |
| JP | S60125768 U | 8/1985 |
| JP | H0722005 A | 1/1995 |
| JP | 2002298804 A | 10/2002 |
| TW | M417912 U | 12/2011 |
| TW | 201351786 A | 12/2013 |
| WO | 2020200338 A1 | 10/2020 |

(a)

(b)

(a)

(b)

(a)

(b)

(c)

(a)

(b)

PRINTED CIRCUIT BOARD PCB ASSEMBLY AND ELECTRONIC DEVICE

CROSS-REFERENCE TO RELATED APPLICATIONS

This application is a national stage of International Application No. PCT/CN2022/115914, filed on Aug. 30, 2022, which claims priority to Chinese Patent Application No. 202111216999. X, filed on Oct. 19, 2021. The disclosures of both of the aforementioned application are hereby incorporated by reference in their entireties.

TECHNICAL FIELD

This application relates to the field of terminal technologies, and in particular, to a printed circuit board PCB assembly and an electronic device.

BACKGROUND

To increase a charging speed of terminal devices, dual batteries are increasingly used in the industry as an apparatus for supplying power to terminal devices.

Supplying power by using dual batteries requires that impedance of a power cable connecting two battery negative electrodes is lower than a preset impedance threshold. As a common low-impedance material, a steel sheet is usually installed on a surface of a printed circuit board (Printed-circuit Board, PCB), and serves as a power cable for connecting two battery negative electrodes. It should be noted that the thicker and wider the conductor, the smaller its impedance. Therefore, a width of a steel sheet that serves as a power cable is usually greater than a preset width threshold. As more and more components are used on the PCB, a steel sheet mounted on a surface occupies a relatively large area on the PCB, and consequently, an area of another component that can be installed on the PCB is reduced.

Therefore, how to reduce an area proportion of the power cable connecting the two battery negative electrodes on the PCB becomes an urgent problem to be resolved.

SUMMARY

Embodiments of this application provide a printed circuit board PCB assembly and an electronic device, so as to reduce an area proportion of a power cable connecting two battery negative electrodes on a PCB.

According to a first aspect, a printed circuit board PCB assembly, where the PCB assembly includes a PCB, a first conductor, a first battery, and a second battery; the PCB includes a groove area:
  the first battery and the second battery are disposed on different sides of the groove area; and
  the first conductor is disposed in the groove area, and the first conductor is configured to connect the first battery and the second battery.

According to the PCB assembly provided in this embodiment of this application, the PCB assembly includes a PCB, a first conductor, a first battery, and a second battery. The PCB includes a groove area. The first battery and the second battery are disposed on different sides of the groove area. The first conductor is disposed in the groove area, and the first conductor is configured to connect the first battery and the second battery. That is, in this embodiment of this application, the first battery and the second battery are connected by using the first conductor in the groove area, thereby preventing a power cable connecting the first battery and the second battery from occupying an area on the PCB, and increasing an area in which other components can be installed on the PCB.

In an embodiment, the PCB component further includes a target component, the target component is a component disposed in the groove area, and the first conductor is a bracket that fastens the target component to the groove area.

The PCB assembly provided in this embodiment of this application includes a PCB, a first conductor, a first battery, and a second battery, and a target component. The PCB includes a groove area. The first battery and the second battery are disposed on different sides of the groove area. The first conductor is disposed in the groove area, and the first conductor is a bracket that fastens the target component to the groove area, and is configured to connect the first battery and the second battery. The target component is a component disposed in the groove area. That is, the first conductor that is configured to connect the first battery and the second battery is a reused bracket that fastens the target component to the groove area, thereby further reducing an area occupied by the power cable connecting the first battery and the second battery on the PCB, reducing costs of the PCB assembly, and increasing an area in which other components can be installed on the PCB.

In an embodiment, the PCB assembly further includes an insulating material, and the insulating material is disposed between the first conductor and the target component.

In a possible case, when a bottom of the target component is a conductor, disposing the insulating material between the first conductor and the target component can avoid short circuit between the target component and the first battery and the second battery.

In an embodiment, the target component is a camera module.

In this embodiment of this application, that the target component is a camera module is equivalent to that the first conductor that is configured to connect the first battery and the second battery reuses the bracket that fastens the target component to the groove area, thereby further reducing an area occupied by the power cable connecting the first battery and the second battery on the PCB, reducing costs of the PCB assembly, and increasing an area in which other components can be installed on the PCB.

In an embodiment, when a distance between the first battery and the groove area is greater than a preset distance threshold, the PCB assembly further includes a second conductor, the second conductor is disposed between the first battery and the groove area, and the second conductor is configured to connect the first conductor and the first battery; and/or when a distance between the second battery and the groove area is greater than the preset distance threshold, the PCB assembly further includes a third conductor, the third conductor is disposed between the second battery and the groove area, and the third conductor is configured to connect the first conductor and the second battery.

In this embodiment of this application, the PCB assembly includes a PCB, a first conductor, a first battery, a second battery, a target component, and a second conductor. The PCB includes a groove area. The first battery and the second battery are disposed on different sides of the groove area. The first conductor is disposed in the groove area. The target component is a component disposed in the groove area. The first conductor is also a bracket that fastens the target component to the groove area. A distance between the first battery and the groove area is greater than a preset distance threshold. The second conductor is disposed between the first battery and the groove area. The second conductor is connected to the first battery and the second battery by using the first conductor and the second conductor. That is, the first battery may be disposed in a position far away from the groove area, and does not need to be disposed close to the groove area. When the first battery is disposed at the position away from the groove area, the first battery and the second battery may be connected by using the first conductor and the second conductor, thereby improving flexibility of the disposing position of the first battery.

In an embodiment, a width of each of the first conductor, the second conductor, and the third conductor is greater than a preset width threshold.

In an embodiment, the first conductor is fastened to the groove area by using a welding method.

In this embodiment of this application, the first conductor is fastened to the groove area by using a welding method. Only a relatively small pad needs to be disposed on the PCB, so that the first conductor can be fastened to the groove area. This further reduces an area occupied by the power cable of the first battery and the second battery on the PCB, and increases an area in which other components can be installed on the PCB.

According to a second aspect, an electronic device is provided, where the electronic device includes a printed circuit board PCB assembly, and the PCB assembly includes a PCB, a first conductor, a first battery, and a second battery: the PCB includes a groove area: the first battery and the second battery are disposed on different sides of the groove area; and the first conductor is disposed in a groove area, and the first conductor is configured to connect the first battery and the second battery.

In an embodiment, the PCB component further includes a target component, the target component is a component disposed in the groove area, and the first conductor is a bracket that fastens the target component to the groove area.

In an embodiment, the PCB assembly further includes an insulating material, and the insulating material is disposed between the first conductor and the target component.

In an embodiment, when a distance between the first battery and the groove area is greater than a preset distance threshold, the PCB assembly further includes a second conductor, the second conductor is disposed between the first battery and the groove area, and the second conductor is configured to connect the first conductor and the first battery; and/or when a distance between the second battery and the groove area is greater than the preset distance threshold, the PCB assembly further includes a third conductor, the third conductor is disposed between the second battery and the groove area, and the third conductor is configured to connect the first conductor and the second battery.

In an embodiment, a width of each of the first conductor, the second conductor, and the third conductor is greater than a preset width threshold.

In an embodiment, the first conductor is fastened to the groove area by using a welding method.

DESCRIPTION OF EMBODIMENTS

Technical solutions in the embodiments of this application are described below with reference to the accompanying drawings in the embodiments of this application. In descriptions of embodiments of this application, unless otherwise specified, "/" means "or", for example, A/B may mean "A or B": "and/or" used herein is only used to describe an association relationship between associated objects, and indicates that three relationships may exist. For example, "A and/or B" may indicate the following: Only A exists, both A and B exist, and only B exists. In addition, in the descriptions of embodiments of this application, "a plurality of" means two or more than two.

In the following, the terms "first". "second", and "third" are used for descriptive purposes only, and cannot be construed as indicating or implying relative importance or implicitly indicating the quantity of technical features indicated. Therefore, the features defined with "first". "second" and "third" may explicitly or implicitly include one or more of the features.

A PCB assembly provided in embodiments of this application may be applied to an electronic device. Optionally, the electronic device may be a laptop computer, a tablet computer, a palmtop computer, a vehicle-mounted terminal, a point of sales terminal, a wearable device, a mobile phone, or the like.

Figure 1:
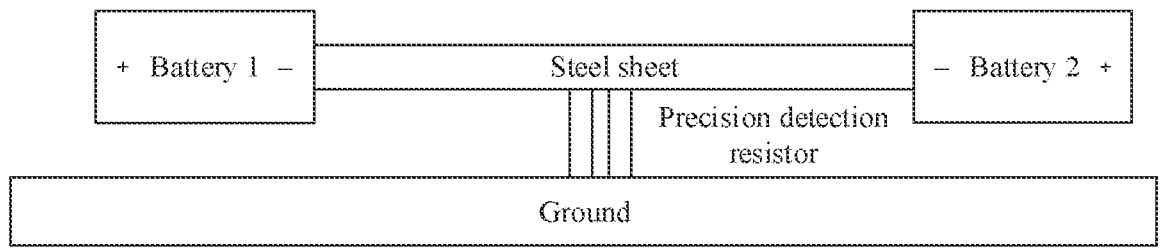
FIG. 1 is a schematic diagram of a dual-power connection.

Currently, an electronic device using dual-battery power supply is used, and negative electrodes of the two batteries are connected by using a power cable. For example, as shown in FIG. 1, a power cable connecting two battery negative electrodes may be a steel sheet, and the steel sheet may be attached to a surface of the PCB by using a surface mounted technology (Surface Mounted Technology, SMT). The steel sheet is grounded by using a precision detection resistor, and the precision detection resistor may be configured to detect a current value on the steel sheet. To ensure good performance of the dual-battery power supply, it is usually required that impedance of the power cable connecting two battery negative electrodes is lower than a preset impedance threshold (for example, 2 mohms). The wider the conductor is, the lower the impedance is. Therefore, a width of the steel sheet is relatively large.

Figure 2:
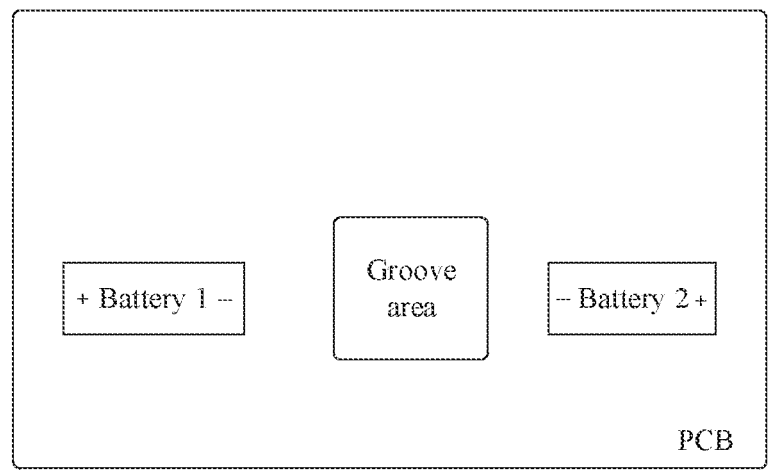
FIG. 2 is a schematic diagram of an application scenario of a PCB assembly according to an embodiment of this application.
Figure 2:
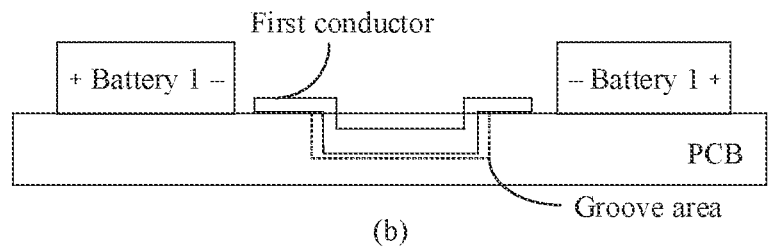

To increase a component-installable area on a PCB, the PCB assembly provided in this embodiment of this application includes a PCB, a first battery, a second battery, and a first conductor. There is a groove area on the PCB, and the first conductor is a conductor disposed in the groove area, and may be configured to support a component disposed in the groove area. The first battery and the second battery are disposed on different sides of the groove area. For example, as shown in (a) in FIG. 2, the first battery is disposed on a left side of the groove area, and the second battery is disposed on a right side of the groove area. As shown in (b) in FIG. 2, in this application, the first conductor in the groove area is reused as a power cable that connects the first battery and the second battery, so that the power cable that connects the first battery and the second battery does not need to occupy an additional area of the PCB, thereby increasing an of an component-installable area on the PCB.

The following describes in detail the PCB assembly provided in embodiments of this application with reference to FIG. 3 to FIG. 10.

Figure 3:
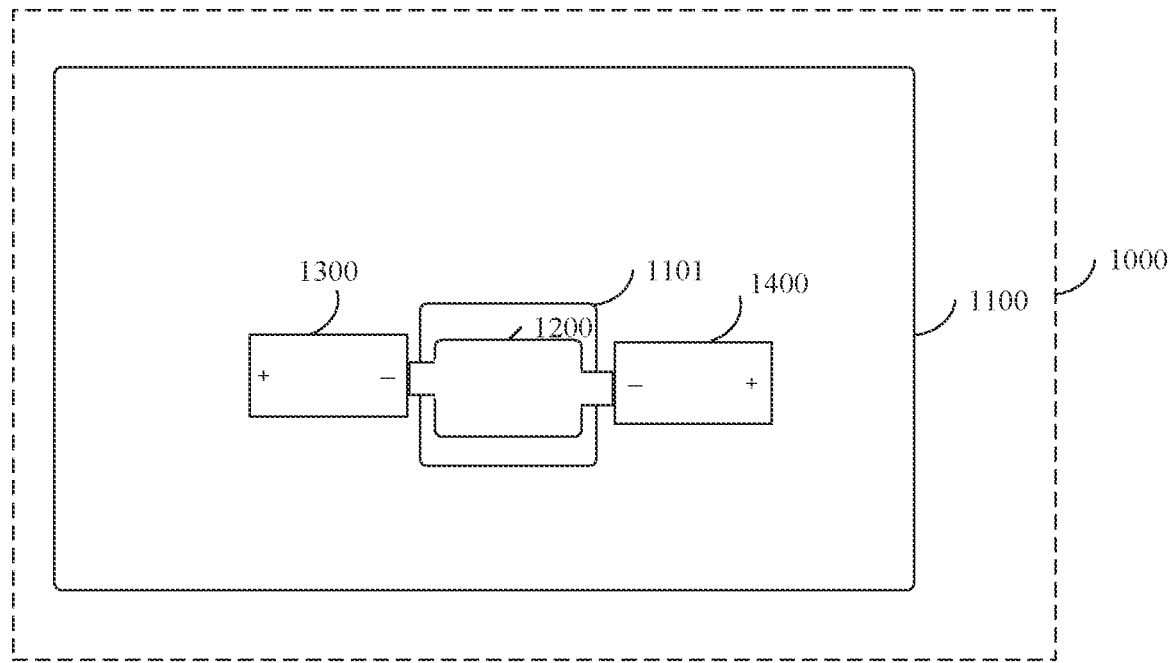
FIG. 3 is a schematic diagram of a structure of a PCB assembly according to an embodiment of this application.
Figure 3:
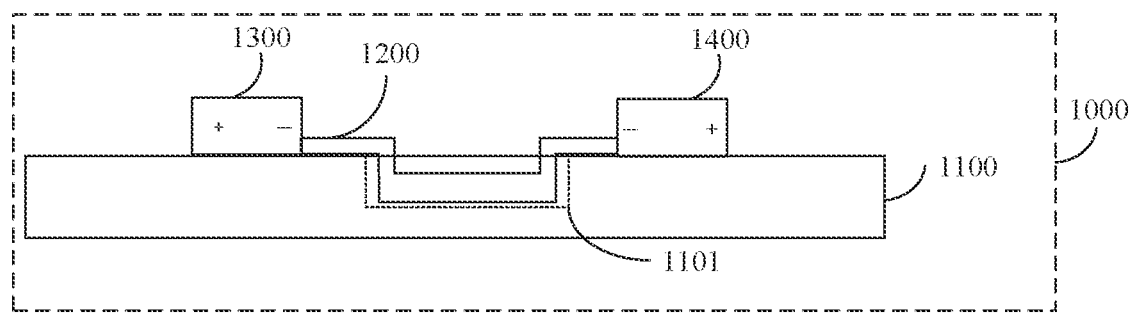

As shown in FIG. 3, an embodiment of this application provides a PCB assembly 1000, and the PCB assembly 1000 includes a PCB 1100, a first conductor 1200, a first battery 1300, and a second battery 1400. The PCB 1100 includes a groove area 1101. The first battery 1300 and the second battery 1400 are disposed on different sides of the groove area 1101. The first conductor 1200 is disposed in a groove area 1101, and the first conductor 1200 is configured to connect the first battery 1300 and the second battery 1400.

It should be noted that (a) in FIG. 3 is a top view of the PCB assembly 1000 according to an embodiment of this application, and (b) in FIG. 3 is a side view of the PCB assembly 1000 shown in (a) in FIG. 3.

It should be understood that the groove area 1101 may be disposed in any area on the PCB 1100. A position of the groove area 1101 on the PCB 1100 is not limited in this embodiment of this application. The first battery 1300 and the second battery 1400 are disposed on different sides of the groove area 1101.

Figure 4:
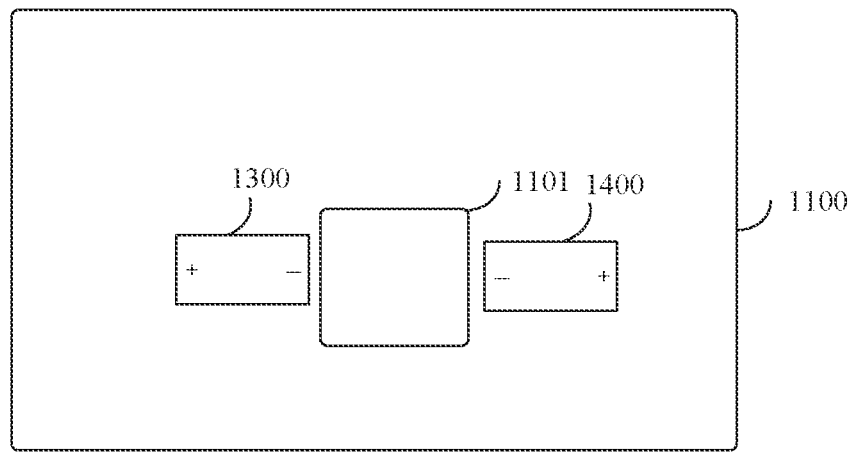
FIG. 4 is a schematic diagram of a battery position of a PCB assembly according to an embodiment of this application.
Figure 4:
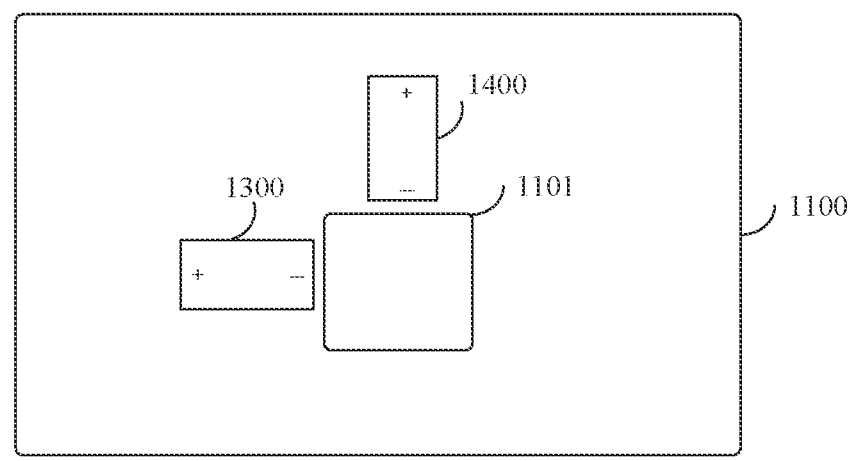
Figure 4:
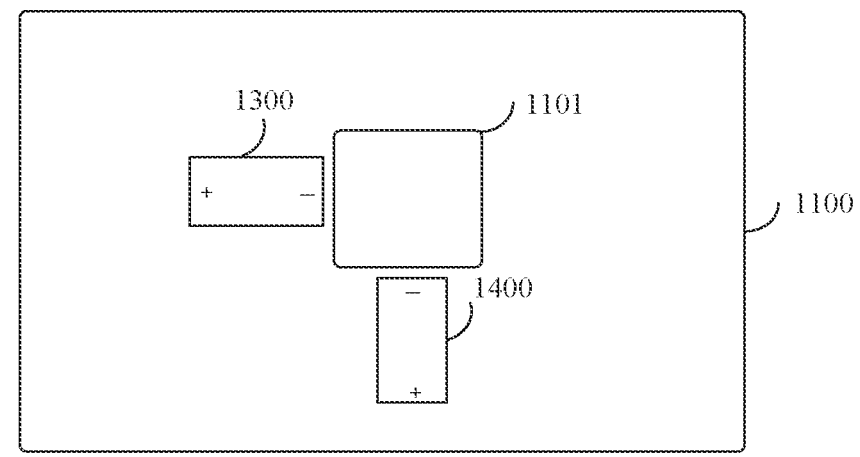

For example, as shown in (a) in FIG. 4, the first battery 1300 may be disposed on a left side of the groove area 1101, and the second battery 1400 is disposed on a right side of the groove area 1101. Alternatively, as shown in (b) in FIG. 4, the first battery 1300 may be disposed on the left side of the groove area 1101, and the second battery 1400 is disposed on a top of the groove area 1101. Alternatively, as shown in (c) in FIG. 4, the first battery 1300 may be disposed on the left side of the groove area 1101, and the second battery 1400 is disposed under the groove area 1101. That is, the first battery 1300 and the second battery 1400 may be flexibly disposed on different sides of the groove area 1101 based on a requirement of the user.

The following uses an example in which the first battery 1300 is disposed on the left side of the groove area 1101, and the second battery 1400 is disposed on the right side of the groove area 1101 to describe how to connect the first battery 1300 and the second battery 1400 by using the first conductor 1200.

The first conductor 1200 is a metal conductor disposed on the groove area 1101. A metal type of the first conductor 1200 is not limited in embodiments of this application. In a possible case, the first conductor 1200 may be a bracket configured to support a component installed on the PCB 1100. When the first conductor 1200 is bracket that supports a component, the first conductor 1200 may be a steel sheet. Because a resistance coefficient of a steel material is relatively low, a width of the first conductor 1200 may be less than a width of a power cable of an inter-PCB cable.

For example, as shown in (a) in FIG. 3 and (b) in FIG. 3, when the first battery 1300 is disposed on the left side of the groove area 1101 and the second battery 1400 is disposed on the right side of the groove area 1101, the first conductor 1200 may be used as a power cable that connects a negative electrode of the first battery 1300 and a negative electrode of the second battery 1400, so that the negative electrode of the first battery 1300 and the negative electrode of the second battery 1400 are conductive, thereby implementing dual-battery power supply of the electronic device.

According to the PCB assembly provided in this embodiment of this application, the PCB assembly includes a PCB, a first conductor, a first battery, and a second battery. The PCB includes a groove area. The first battery and the second battery are disposed on different sides of the groove area. The first conductor is disposed in the groove area, and the first conductor is configured to connect the first battery and the second battery. That is, in this embodiment of this application, the first battery and the second battery are connected by using the first conductor in the groove area, thereby preventing a power cable connecting the first battery and the second battery from occupying an area on the PCB, and increasing an area in which other components can be installed on the PCB.

Figure 5:
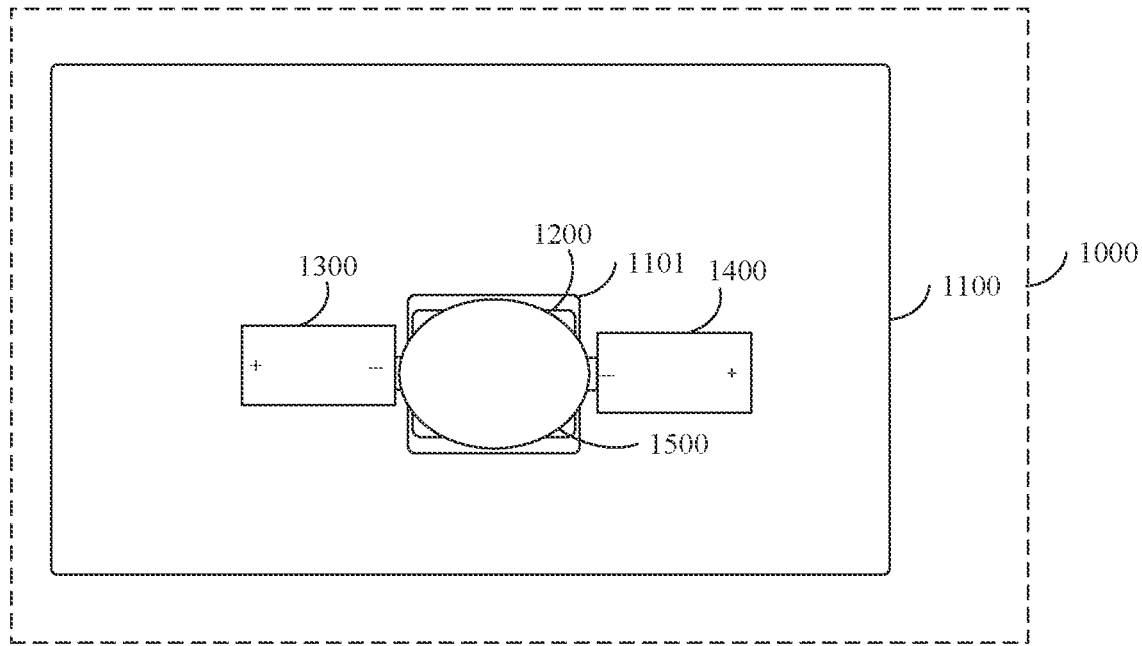
FIG. 5 is a schematic diagram of a structure a PCB assembly according to another embodiment of this application.
Figure 5:
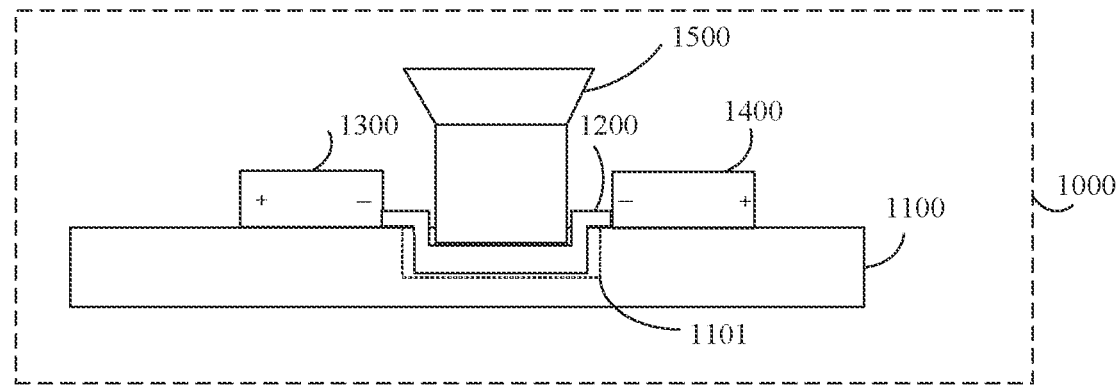

In an embodiment, as shown in FIG. 5, a PCB assembly 1000 is provided. The PCB assembly 1000 includes a PCB 1100, a first conductor 1200, a first battery 1300, a second battery 1400, and a target component 1500. The PCB 1100 includes a groove area 1101. The first battery 1300 and the second battery 1400 are disposed on different sides of the groove area 1101. The first conductor 1200 is disposed in the groove area 1101. The first conductor 1200 is configured to connect the first battery 1300 and the second battery 1400. The target component 1500 is a component disposed in the groove area 1101. The first conductor 1200 is also a bracket that fastens the target component 1500 to the groove area 1101.

It should be noted that (a) in FIG. 5 is a top view of the PCB assembly 1000, and (b) in FIG. 5 is a side view of the PCB assembly 1000 shown in (a) in FIG. 5.

Generally, the target component 1500 is a component with a relatively large size. When the target component 1500 is installed on the PCB 1100, a groove needs to be dug on the PCB 1100 to obtain the groove area 1101, and then the target component 1500 is installed in the groove area. A type of the target component 1500 is not limited in this embodiment of this application.

Optionally, the target component 1500 may be a camera module.

The first conductor 1200 is a bracket that fastens the target component 1500 to the groove area 1101. It should be noted that a connection apparatus for fastening the target component 1500 to the first conductor 1200 is disposed on the first conductor 1200. Then, the first conductor 1200 may be fastened to the groove area 1101, so that the first conductor 1200 can be fastened to the groove area 1101, and the target component 1500 can be fastened to the groove area.

When the target component 1500 is a camera module, because the camera module is usually large, a width of the first conductor 1200 used to fasten the camera module is also usually large. For example, the width of the first conductor 1200 may be the same as the width of the camera module. For example, when the width of the camera module is 7.8 mm, the width of the first conductor 1200 may be set to 7.8 mm, and a thickness may be set to 0.2 mm. When the width of the first conductor 1200 is the same as the width of the camera module, the first conductor 1200 can better support the camera module.

In a possible case, the width of the first conductor 1200 may be less than the width of the target component 1500. It should be noted that impedance of the power cable between the first battery 1300 and the second battery 1400 must be less than a preset impedance threshold, so that dual-battery power supply can be implemented. The impedance of the power cable is closely related to a width thereof. The wider the power cable is, the lower the impedance is. Therefore, the width of the first conductor 1200 used to connect the first battery 1300 and the second battery 1400 needs to be greater than a preset width threshold. The preset width threshold may be obtained through calculation according to an impedance calculation formula of the conductor. For example, according to the impedance calculation formula of the conductor, a minimum width of the first conductor 1200 may be set to 3 mm, and a thickness may be set to 0.2 mm. When the width of the first conductor is less than the width of the target component 1500, a total area of the first conductor 1500 is relatively small, and costs of the first conductor 1500 may be reduced.

In conclusion, the width of the first conductor 1200 may be the same as or different from the width of the target component 1500, which is not limited in this embodiment of this application.

For example, a clamping groove may be disposed on the first conductor 1200, and the clamping groove is used to fasten the target component 1500 to the first conductor 1200. Alternatively, an adhesive material may be disposed on the first conductor 1200, and the target component 1500 is bonded to the first conductor 1200. This is not limited in this embodiment of this application.

For example, the first conductor 1200 may be fastened to the groove area 1101 by using a welding method. For example, a flange for welding is disposed on the first conductor 1200, and a pad is disposed on an area adjacent to the groove area 1101 on the PCB 1100 (an area of the pad is usually relatively small). By welding the flange on the first conductor 1200 to the pad disposed on the adjacent area, the first conductor 1200 is fastened to the groove area 1101.

In this embodiment of this application, the first conductor is fastened to the groove area by using a welding method. Only a relatively small pad needs to be disposed on the PCB, so that the first conductor can be fastened to the groove area. This further reduces an area occupied by the power cable of the first battery and the second battery on the PCB, and increases an area in which other components can be installed on the PCB.

Figure 6:
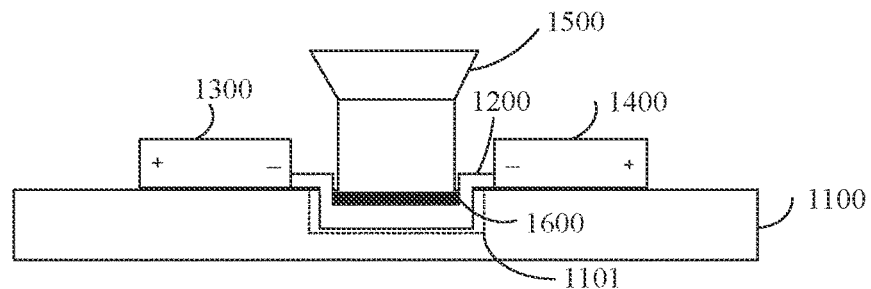
FIG. 6 is a schematic diagram of a structure of a first conductor, an insulating material, and a target component according to an embodiment of this application.

To avoid short circuit between the target component 1500 and the first battery 1300 and the second battery 1400, optionally, as shown in FIG. 6, an insulating material 1600 may be disposed between the first conductor 1200 and the target component 1500.

The insulating material 1600 is usually a material with excellent electrical insulation, which can still maintain electrical insulation well at high frequencies. For example, the insulating material 1600 may be Polyethylene terephthalate (Polyethylene terephthalate, PET).

The PCB assembly provided in this embodiment of this application includes a PCB, a first conductor, a first battery, and a second battery, and a target component. The PCB includes a groove area. The first battery and the second battery are disposed on different sides of the groove area. The first conductor is disposed in the groove area, and the first conductor is a bracket that fastens the target component to the groove area, and is configured to connect the first battery and the second battery. The target component is a component disposed in the groove area. That is, the first conductor that is configured to connect the first battery and the second battery is a reused bracket that fastens the target component to the groove area, thereby further reducing an area occupied by the power cable connecting the first battery and the second battery on the PCB, reducing costs of the PCB assembly, and increasing an area in which other components can be installed on the PCB.

Figure 7:
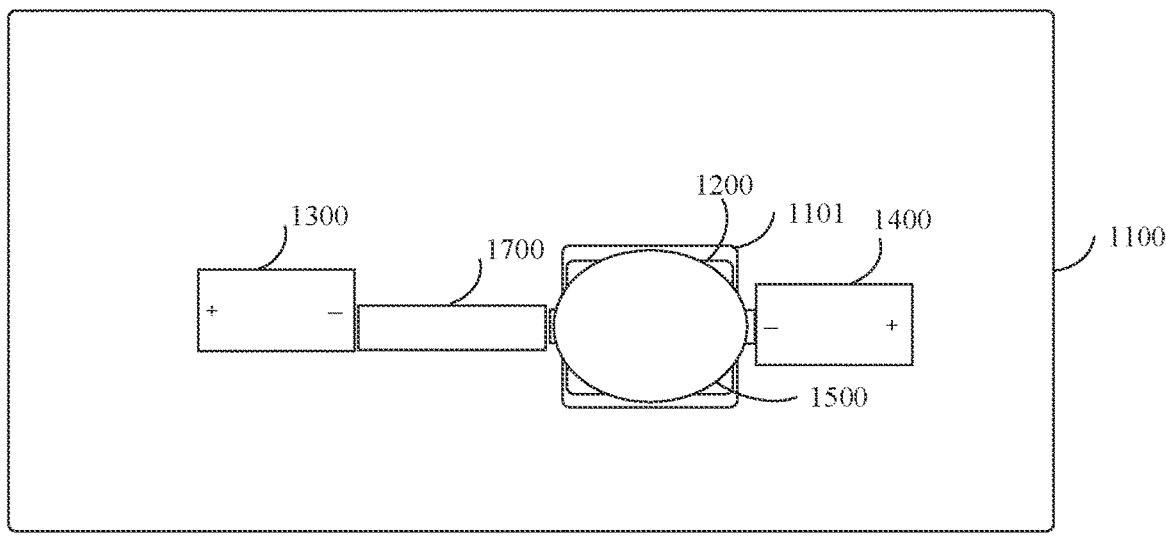
FIG. 7 is a schematic diagram of a structure a PCB assembly according to another embodiment of this application.
Figure 7:
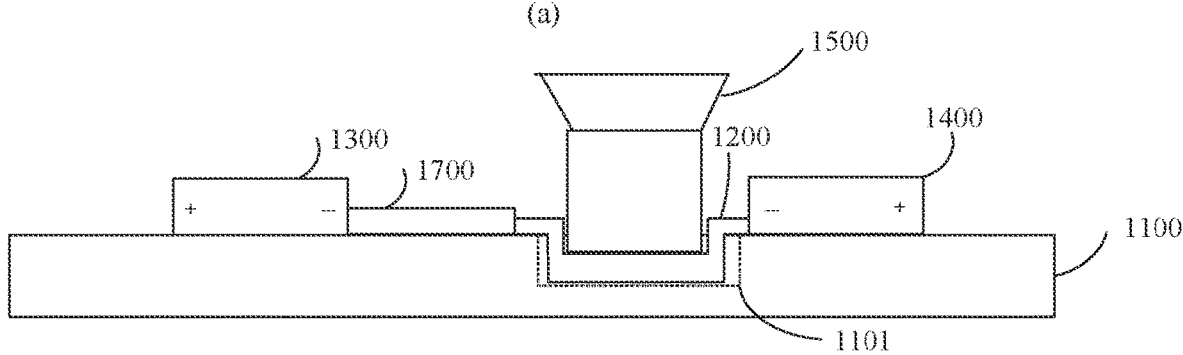

In an example, as shown in FIG. 7, a PCB assembly 1000 is provided. The PCB assembly 1000 includes a PCB 1100, a first conductor 1200, a first battery 1300, a second battery 1400, a target component 1500, and a second conductor 1700. The PCB 1100 includes a groove area 1101. The first battery 1300 and the second battery 1400 are disposed on different sides of the groove area 1101. The first conductor 1200 is disposed in the groove area 1101. The target component 1500 is a component disposed in the groove area 1101. The first conductor 1200 is also a bracket that fastens the target component 1500 to the groove area 1101. A distance between the first battery 1300 and the groove area 1101 is greater than a preset distance threshold. The second conductor 1700 is disposed between the first battery 1300 and the groove area 1101. The first battery 1300 and the second battery 1400 are connected by using the second conductor 1700 and the first conductor 1200.

It should be noted that (a) in FIG. 7 is a top view of the PCB assembly 1000, and (b) in FIG. 7 is a side view of the PCB assembly 1000 shown in (a) in FIG. 7.

In a possible case, a user needs to place the first battery 1300 in a position away from the groove area 1101. In this case, the distance between the first battery 1300 and the groove area 1101 is large. When the distance between the first battery 1300 and the groove area 1101 is greater than the preset distance threshold, the second conductor 1700 may be used as a power cable that connects the first conductor 1200 and the first battery 1300, and then the first conductor 1200 is connected to the second battery 1400, to implement connection between the first battery 1300 and the second battery 1400.

It should be noted that the second conductor 1700 may be a metal conductor, and a metal type of the second conductor 1200 is not limited in this embodiment of this application. In an example, the second conductor 1700 may be a steel sheet. When the second conductor 1700 is a steel sheet, because a resistance coefficient of the steel material is relatively low, a width of the second conductor 1700 is usually less than a width of a power cable of an inter-PCB cable.

In this embodiment of this application, the PCB assembly includes a PCB, a first conductor, a first battery, a second battery, a target component, and a second conductor. The PCB includes a groove area. The first battery and the second battery are disposed on different sides of the groove area. The first conductor is disposed in the groove area. The target component is a component disposed in the groove area. The first conductor is also a bracket that fastens the target component to the groove area. A distance between the first battery and the groove area is greater than a preset distance threshold. The second conductor is disposed between the first battery and the groove area. The second conductor is connected to the first battery and the second battery by using the first conductor and the second conductor. That is, the first battery may be disposed in a position far away from the groove area, and does not need to be disposed close to the groove area. When the first battery is disposed at the position away from the groove area, the first battery and the second battery may be connected by using the first conductor and the second conductor, thereby improving flexibility of the disposing position of the first battery.

Figure 8:
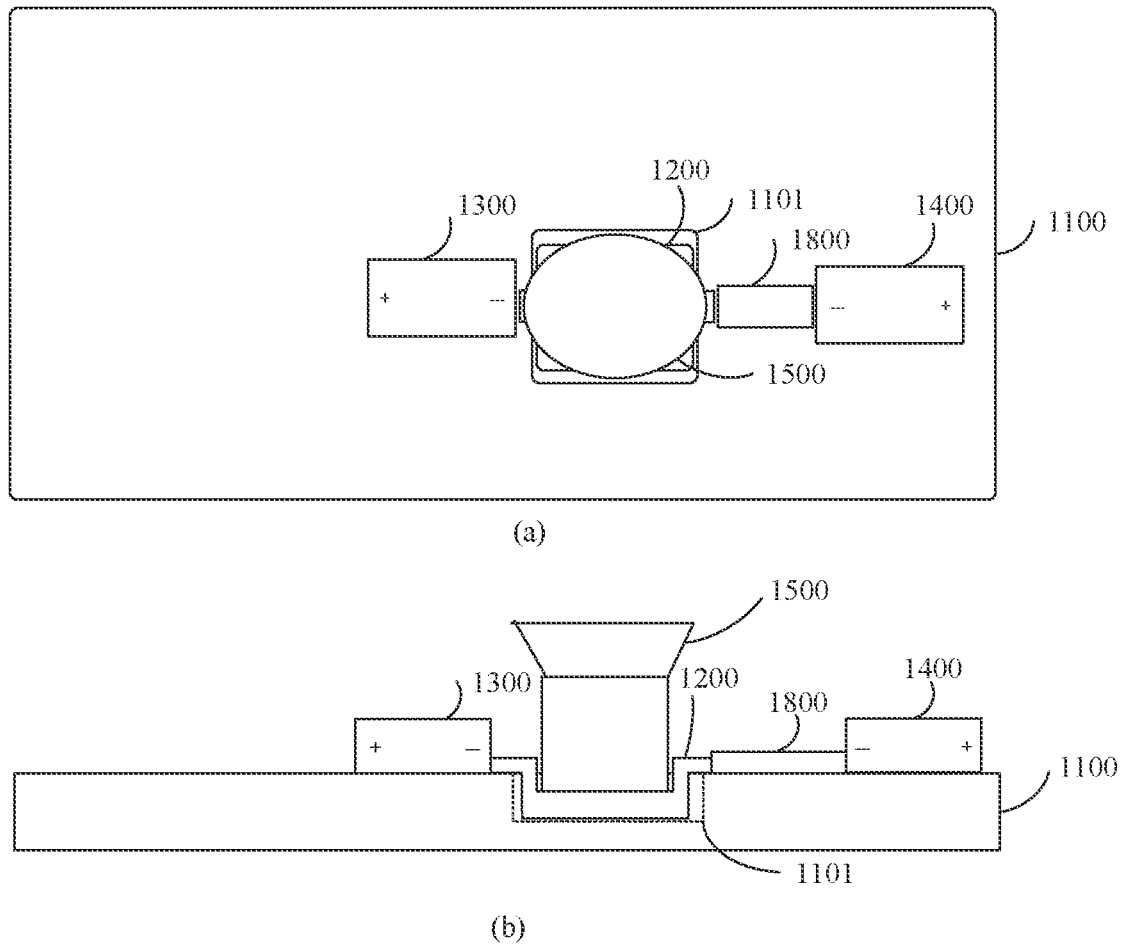
FIG. 8 is a schematic diagram of a structure a PCB assembly according to another embodiment of this application.

In an example, as shown in FIG. 8, a PCB assembly 1000 is provided. The PCB assembly 1000 includes a PCB 1100, a first conductor 1200, a first battery 1300, a second battery 1400, a target component 1500, and a third conductor 1800. The PCB 1100 includes a groove area 1101. The first battery 1300 and the second battery 1400 are disposed on different sides of the groove area 1101. The first conductor 1200 is disposed in the groove area 1101. The target component 1500 is a component disposed in the groove area 1101. The first conductor 1200 is also a bracket that fastens the target component 1500 to the groove area 1101. A distance between the second battery 1400 and the groove area 1101 is greater than a preset distance threshold. The third conductor 1800 is disposed between the second battery 1400 and the groove area 1101. The first battery 1300 and the second battery 1400 are connected by using the third conductor 1800 and the first conductor 1200.

It should be noted that (a) in FIG. 8 is a top view of the PCB assembly 1000, and (b) in FIG. 8 is a side view of the PCB assembly 1000 shown in (a) in FIG. 8.

In a possible case, a user needs to place the second battery 1400 in a position away from the groove area 1101. In this case, the distance between the second battery 1400 and the groove area 1101 is large. When the distance between the second battery 1400 and the groove area 1101 is greater than the preset distance threshold, the second conductor 1800 may be used as a power cable that connects the first conductor 1200 and the second battery 1400, and then the first conductor 1200 is connected to the first battery 1300, to implement connection between the first battery 1300 and the second battery 1400.

The third conductor 1800 may be a metal conductor. A metal type of the third conductor 1800 is not limited in this embodiment of this application. In an example, the third conductor 1800 may be a steel sheet. When the third conductor 1800 is a steel sheet, because a resistance coefficient of the steel material is relatively low, a width of the third conductor 1800 is usually less than a width of a power cable of an inter-PCB cable.

In this embodiment of this application, the PCB assembly includes a PCB, a first conductor, a first battery, a second battery, a target component, and a third conductor. The PCB includes a groove area. The first battery and the second battery are disposed on different sides of the groove area. The first conductor is disposed in the groove area. The target component is a component disposed in the groove area. The first conductor is also a bracket that fastens the target component to the groove area. A distance between the second battery and the groove area is greater than a preset distance threshold. The third conductor is disposed between the second battery and the groove area. The first battery and the second battery are connected by using the first conductor and the third conductor. That is, when the second battery is disposed at a position away from the groove area, the first battery and the second battery may be connected by using the first conductor and the third conductor, thereby improving flexibility of the disposing position of the second battery.

Figure 9:
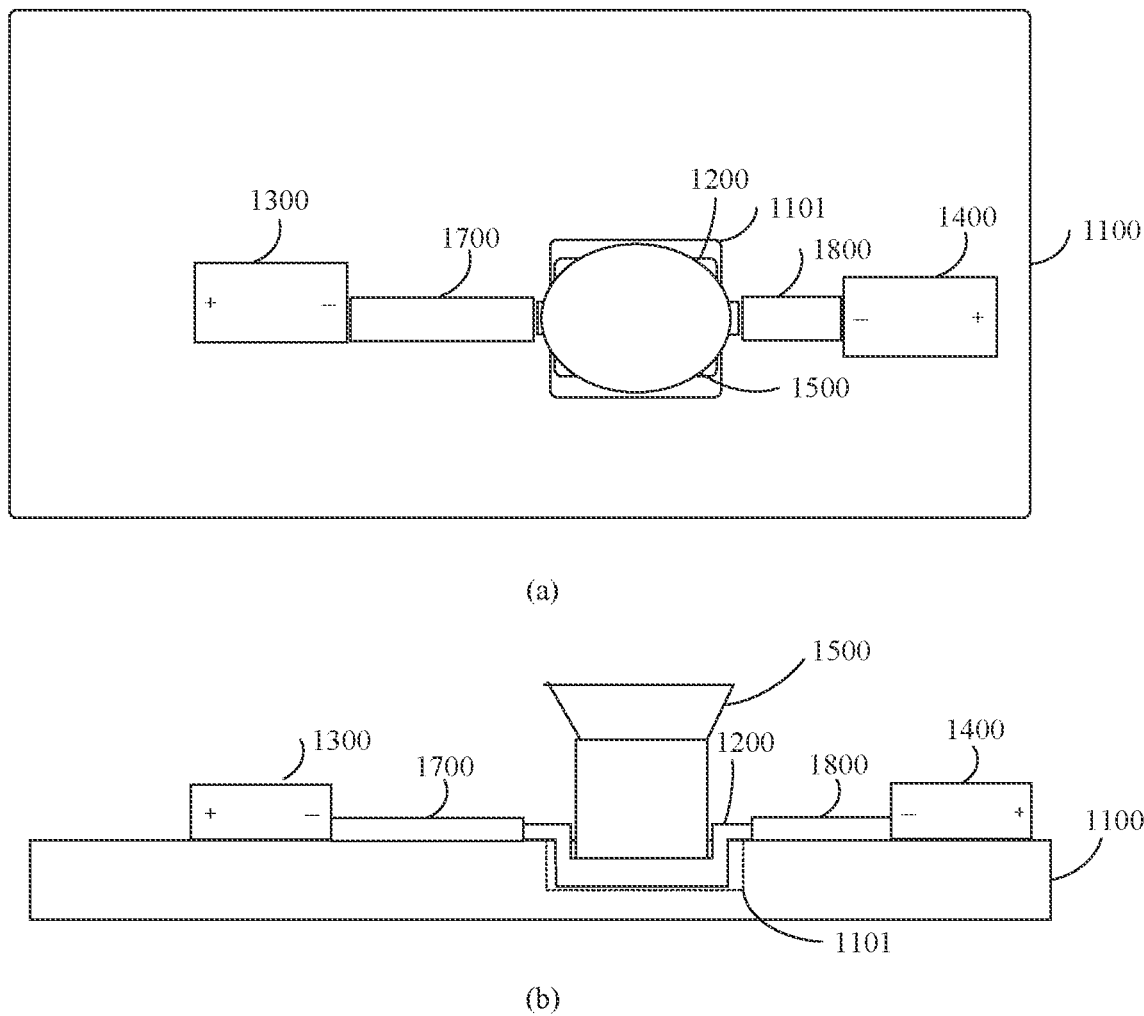
FIG. 9 is a schematic diagram of a structure a PCB assembly according to another embodiment of this application.

In an example, as shown in FIG. 9, a PCB assembly 1000 is provided. The PCB assembly 1000 includes a PCB 1100, a first conductor 1200, a first battery 1300, a second battery 1400, a target component 1500, a second conductor 1700, and a third conductor 1800. The PCB 1100 includes a groove area 1101. The first battery 1300 and the second battery 1400 are disposed on different sides of the groove area 1101. The first conductor 1200 is disposed in the groove area 1101. The target component 1500 is a component disposed in the groove area 1101. The first conductor 1200 is also a bracket that fastens the target component 1500 in the groove area 1101. A distance between the first battery 1300 and the groove area 1101 is greater than a preset distance threshold. The second conductor 1700 is disposed between the first battery 1300 and the groove area 1101, and is configured to connect the first conductor 1200 and the first battery 1300. A distance between the second battery 1400 and the groove area 1101 is greater than a preset distance threshold. The third conductor 1800 is disposed between the second battery 1400 and the groove area 1101, and is configured to connect the first conductor 1300 and the second battery 1400.

It should be noted that (a) in FIG. 9 is a top view of the PCB assembly 1000, and (b) in FIG. 9 is a side view of the PCB assembly 1000 shown in (a) in FIG. 9.

In a possible case, a user needs to place the first battery 1300 and the second battery 1400 in positions far away from the groove area 1101. In this case, a distance between the first battery 1300 and the groove area 1101 is relatively large, and a distance between the second battery 1400 and the groove area 1101 is relatively large. When the distance between the first battery 1300 and the groove area 1101 is greater than a preset distance threshold, the second conductor 1700 may be used as a power cable that connects the first conductor 1200 and the first battery 1300. In addition, the distance between the second battery 1400 and the groove area 1101 is also greater than a preset distance threshold. The third conductor 1800 is used as a power cable that connects the first conductor 1200 and the second battery 1400. This is equivalent to using the first conductor 1200, the second conductor 1700, and the third conductor 1800 as a power cable that connects the first battery 1300 and the second battery 1400, thereby implementing connection between the first battery 1300 and the second battery 1400.

Impedance of the power cable between the first battery 1100 and the second battery 1300 must be less than a preset impedance threshold, so that dual-battery power supply can be implemented. The impedance of the power cable is closely related to a width thereof. The wider the power cable is, the lower the impedance is. Therefore, a width of each of the first conductor 1200, the second conductor 1700, and the third conductor 1800 that are used to connect the first battery 1100 and the second battery 1300 needs to be greater than a preset width threshold.

In this embodiment of this application, the PCB assembly includes a PCB, a first conductor, a first battery, a second battery, a target component, a second conductor, and a third conductor. The PCB includes a groove area, and the first battery and the second battery are disposed on different sides of the groove area. The first conductor is disposed in the groove area. The target component is a component disposed in the groove area. The first conductor is also a bracket that fastens the target component to the groove area. A distance between the first battery and the groove area is greater than a preset distance threshold. The second conductor is disposed between the first battery and the groove area. The second conductor is configured to connect the first conductor and the first battery. A distance between the second battery and the groove area is greater than a preset distance threshold. The third conductor is disposed between the second battery and the groove area. The third conductor is configured to connect the first conductor and the second battery. That is, when both the first battery and the second battery are far away from the groove area, the first battery and the second battery may be connected by using the first conductor, the second conductor, and the third conductor, thereby improving flexibility of the disposing positions of the first battery and the position of the second battery.

In a possible case, an electronic device is further provided in this application, where the electronic device includes a printed circuit board PCB assembly, and the PCB assembly includes a PCB, a first conductor, a first battery, and a second battery. The PCB includes a groove area. The first battery and the second battery are disposed on different sides of the groove area. The first conductor is disposed in the groove area, and the first conductor is configured to connect the first battery and the second battery.

In an embodiment, the PCB component further includes a target component, the target component is a component disposed in the groove area, and the first conductor is a bracket that fastens the target component to the groove area.

In an embodiment, the PCB assembly further includes an insulating material, and the insulating material is disposed between the first conductor and the target component.

In an embodiment, when a distance between the first battery and the groove area is greater than a preset distance threshold, the PCB assembly further includes a second conductor, the second conductor is disposed between the first battery and the groove area, and the second conductor is configured to connect the first conductor and the first battery; and/or when a distance between the second battery and the groove area is greater than the preset distance threshold, the PCB assembly further includes a third conductor, the third conductor is disposed between the second battery and the groove area, and the third conductor is configured to connect the first conductor and the second battery.

In an embodiment, a width of each of the first conductor, the second conductor, and the third conductor is greater than a preset width threshold.

In an embodiment, the first conductor is fastened to the groove area by using a welding method.

An implementation method and technical effects of the electronic device provided in this embodiment of this application are similar to those of the foregoing PCB assembly, and details are not described herein again.

A type of an electronic device is not limited in this embodiment of this application. For example, the electronic device may be but is not limited to a mobile phone, a tablet computer, a smart sound box, a smart large screen (also referred to as a smart TV), a wearable device, or the like.

Figure 10:
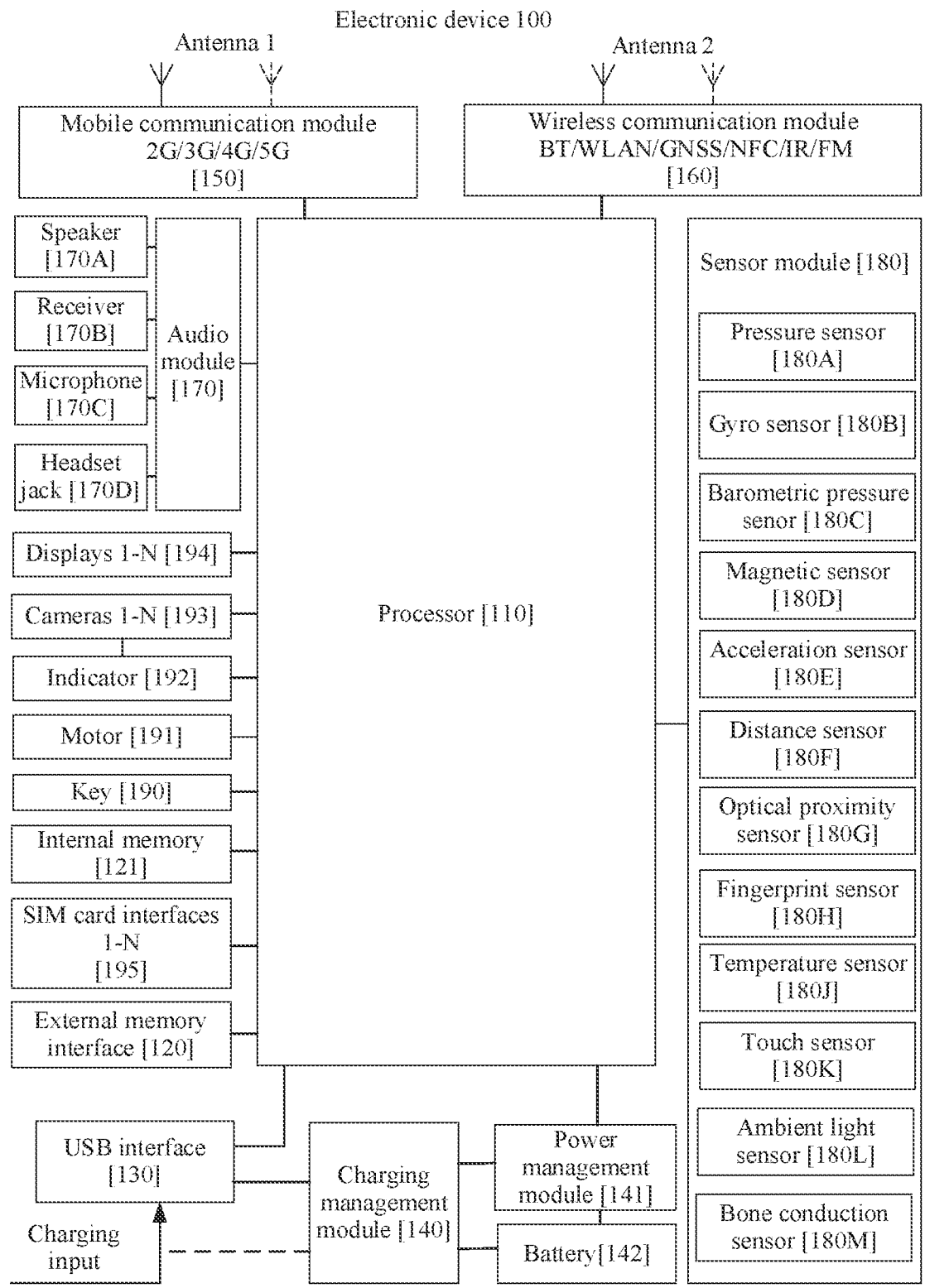
FIG. 10 is a schematic diagram of an electronic device according to an embodiment of this application.

For example. FIG. 10 is a schematic diagram of a structure of an electronic device 100. The electronic device 100 may include a processor 110, an external memory interface 120, an internal memory 121, a universal serial bus (universal serial bus, USB) interface 130, a charging management module 140, a power management module 141, a battery 142, an antenna 1, an antenna 2, a mobile communication module 150, a wireless communication module 160, an audio module 170, a speaker 170A, a receiver 170B, a microphone 170C, a headset jack 170D, a sensor module 180, a key 190, a motor 191, an indicator 192, a camera 193, a display 194, and a subscriber identification module (subscriber identification module, SIM) card interface 195, and the like. The sensor module 180 may include a pressure sensor 180A, a gyro sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, a touch sensor 180K, an ambient light sensor 180L, a bone conduction sensor 180M, and the like.

It may be understood that a structure shown in this embodiment of this application does not constitute a specific limitation on the electronic device 100. In some other embodiments of this application, the electronic device 100 may include more or fewer components than those shown in the figure, or combine some components, or split some components, or have different component arrangements. The illustrated components may be implemented by using hardware, software or a combination of software and hardware.

The processor 110 may include one or more processing units. For example, the processor 110 may include an application processor (application processor, AP), a modem processor, a graphics processing unit (graphics processing unit. GPU), an image signal processor (image signal processor, ISP), a controller, a memory, a video codec, a digital signal processor (digital signal processor, DSP), a baseband processor, and/or a neural-network processing unit (neural-network processing unit. NPU). Different processing units may be independent components, or may be integrated in one or more processors.

The controller may be a nerve center and a command center of the electronic device 100. The controller may generate an operation control signal based on instruction operation code and a timing signal, to complete control of instruction fetch and instruction execution.

A memory may further be disposed in the processor 110, to store instructions and data. In some embodiments, the memory in the processor 110 is a cache. The memory may store an instruction or data that has just been used or is cyclically used by the processor 110. If the processor 110 needs to use the instructions or the data again, the instructions or the data may be directly invoked from the memory. Therefore, repeated access is avoided, and a waiting time of the processor 110 is reduced, thereby improving system efficiency.

It can be understood that the interface connection relationship between the modules illustrated in the embodiments of this application is merely an example for description, and does not constitute a limitation on the structure of the electronic device 100. In some other embodiments of this application, the electronic device 100 may alternatively use an interface connection mode that is different from those in the foregoing embodiments, or use a combination of a plurality of interface connection modes.

The charging management module 140 is configured to receive a charging input from a charger. The charger may be a wireless charger or a wired charger. In some embodiments of wired charging, the charging management module 140 may receive a charging input of a wired charger by using a USB interface 130. In some embodiments of wireless charging, the charging management module 140 may receive a wireless charging input by using a wireless charging coil of the electronic device 100. When charging the battery 142, the charging management module 140 may further supply power to the electronic device 100 by using the power management module 141.

The power management module 141 is configured to be connected to the battery 142, the charging management module 140, and the processor 110. The power management module 141 receives an input from the battery 142 and/or an input from the charging management module 140, and supplies power to the processor 110, the internal memory 121, an external memory, the display 194, the camera 193, the wireless communication module 160, and the like. The power management module 141 may be further configured to monitor a parameter such as a battery capacity, a quantity of battery cycles, and a battery health status (leakage and impedance). In some other embodiments, the power management module 141 may alternatively be disposed in the processor 110. In some other embodiments, the power management module 141 and the charging management module 140 may alternatively be disposed in a same component.

The electronic device 100 can implement a photographing function by using the ISP, the camera 193, the video codec, the GPU, the display 194, the application processor, and the like.

The ISP is configured to process data fed back by the camera 193. For example, during photographing, a shutter is opened, light is transmitted to a photosensitive element of the camera by using a lens, an optical signal is converted into an electrical signal, and the electrical signal is transmitted by the photosensitive element of the camera to the ISP for processing and converted into an image visible to a naked eye. The ISP may further perform algorithm optimization on noise, brightness, and a skin color of the image. The ISP may further optimize parameters such as exposure and a color temperature of a photographing scenario. In some embodiments, the ISP may be disposed on the camera 193.

The camera 193 is configured to capture a still image or a video. An optical image of an object is generated by using a lens and is projected to a photosensitive element. The photosensitive element may be a charge coupled device (charge coupled device. CCD) or a complementary metal-oxide-semiconductor (complementary metal-oxide-semiconductor. CMOS) phototransistor. The photosensitive element converts an optical signal into an electrical signal, and then transmits the electrical signal to the ISP to convert into a digital image signal. The ISP outputs the digital image signal to the DSP for processing. The DSP converts the digital image signal into an image signal in a standard format such as RGB or YUV. In some embodiments, the electronic device 100 may include one or N cameras 193, where N is a positive integer greater than 1. In some embodiments, the camera 193 may be the foregoing camera module.

It should be noted that any electronic device mentioned in this embodiment of this application may include more or fewer modules than those in the electronic device 100.

In the foregoing embodiments, descriptions of the embodiments have respective focuses. For a part that is not detailed or described in an embodiment, refer to related descriptions in other embodiments. It should be understood that sequence numbers of the foregoing steps do not mean execution sequences in the embodiments. The execution sequences of the processes should be determined based on functions and internal logic of the processes, and should not be construed as any limitation on the implementation processes of the embodiments of this application. In addition, as used herein, the terms such as "first", "second", and "third" are used only for the purpose of description, and should not be understood as indicating or implying relative importance. Referring to "one embodiment" or "some embodiments" or the like described in the specification of this application means that one or more embodiments of this application include a specific feature, structure, or characteristic described with reference to the embodiment. Therefore, the statements "in one embodiment", "in some embodiments", "in some other embodiments", and the like appearing at different positions in this specification do not mean that these embodiments are all necessarily referred to, but mean "one or more but not all embodiments", unless otherwise specifically emphasized in other ways.

Finally, it should be noted that the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A printed circuit board PCB assembly, wherein the PCB assembly comprises a PCB, a first conductor, a first battery, and a second battery; the PCB comprises a groove area;
   the first battery and the second battery are disposed on different sides of the groove area; and
   the first conductor is disposed in the groove area, and the first conductor is configured to connect the first battery and the second battery, wherein
   when a distance between the first battery and the groove area is greater than a preset distance threshold, the PCB assembly further comprises a second conductor, the second conductor is disposed between the first battery and the groove area, and the second conductor is configured to connect the first conductor and the first battery; and/or
   when a distance between the second battery and the groove area is greater than the preset distance threshold, the PCB assembly further comprises a third conductor, the third conductor is disposed between the second battery and the groove area, and the third conductor is configured to connect the first conductor and the second battery.

2. The PCB assembly according to claim 1, wherein the PCB assembly further comprises a target component, the target component is a component disposed in the groove area, and the first conductor is a bracket that fastens the target component to the groove area.

3. The PCB assembly according to claim 2, wherein the PCB assembly further comprises an insulating material, and the insulating material is disposed between the first conductor and the target component.

4. The PCB assembly according to claim 1, wherein a width of each of the first conductor, the second conductor, and the third conductor is greater than a preset width threshold.

5. The PCB assembly according to claim 1, wherein the first conductor is fastened to the groove area by using a welding method.

6. An electronic device, wherein the electronic device comprises a printed circuit board PCB assembly, and the PCB assembly comprises a PCB, a first conductor, a first battery, and a second battery; the PCB comprises a groove area;
   the first battery and the second battery are disposed on different sides of the groove area; and
   the first conductor is disposed in the groove area, and the first conductor is configured to connect the first battery and the second battery, wherein
   when a distance between the first battery and the groove area is greater than a preset distance threshold, the PCB assembly further comprises a second conductor, the second conductor is disposed between the first battery and the groove area, and the second conductor is configured to connect the first conductor and the first battery; and/or
   when a distance between the second battery and the groove area is greater than the preset distance threshold, the PCB assembly further comprises a third conductor, the third conductor is disposed between the second battery and the groove area, and the third conductor is configured to connect the first conductor and the second battery.

7. The electronic device according to claim 6, wherein the PCB assembly further comprises a target component, the target component is a component disposed in the groove area, and the first conductor is a bracket that fastens the target component to the groove area.

8. The electronic device according to claim 7, wherein the PCB assembly further comprises an insulating material, and the insulating material is disposed between the first conductor and the target component.

9. The electronic device according to claim 6, wherein a width of each of the first conductor, the second conductor, and the third conductor is greater than a preset width threshold.

10. The electronic device according to claim 6, wherein the first conductor is fastened to the groove area by using a welding method.

\* \* \* \* \*